US008546957B2

(12) United States Patent
Ko et al.

(10) Patent No.: US 8,546,957 B2
(45) Date of Patent: Oct. 1, 2013

(54) INTEGRATED CIRCUIT PACKAGING SYSTEM WITH DIELECTRIC SUPPORT AND METHOD OF MANUFACTURE THEREOF

(75) Inventors: WonJun Ko, Sungnam-Si (KR); DeokKyung Yang, Hanam-si (KR); Yeongbeom Ko, Seoul (KR)

(73) Assignee: Stats Chippac Ltd., Singapore (SG)

(*) Notice: Subject to any disclaimer, the term of this patent is extended or adjusted under 35 U.S.C. 154(b) by 349 days.

(21) Appl. No.: 12/964,577

(22) Filed: Dec. 9, 2010

(65) Prior Publication Data

US 2012/0146246 A1 Jun. 14, 2012

(51) Int. Cl.
*H01L 29/40* (2006.01)

(52) U.S. Cl.
USPC .......... 257/782; 438/125

(58) Field of Classification Search
USPC .......... 257/782–786; 438/125–127
See application file for complete search history.

(56) References Cited

U.S. PATENT DOCUMENTS 6,400,036 B1 * 6/2002 Tang et al. .......... 257/780
6,919,630 B2 7/2005 Hsiao
6,946,741 B2 9/2005 Yamashita
7,122,893 B2 10/2006 Weng et al.
7,141,452 B2 11/2006 Sambasivam et al.
7,148,560 B2 12/2006 Lee et al.
7,179,683 B2 2/2007 Low et al.
7,564,140 B2 7/2009 Lee et al.
7,682,872 B2 3/2010 Park et al.
2008/0017983 A1 1/2008 Tzeng et al.
2009/0243091 A1 10/2009 Kim et al.
2010/0025847 A1 2/2010 Tomura et al.

FOREIGN PATENT DOCUMENTS

JP 11-150206 A 6/1999

OTHER PUBLICATIONS

U.S. Appl. No. 12/822,405, filed Jun. 24, 2010, Ko et al.
U.S. Appl. No. 12/768,177, filed Apr. 27, 2010, Lee et al.

* cited by examiner

*Primary Examiner* — Julio J Maldonado
*Assistant Examiner* — Robert Bachner
(74) *Attorney, Agent, or Firm* — Ishimaru & Associates LLP

(57) ABSTRACT

A method of manufacture of an integrated circuit packaging system includes: providing a package substrate having an outer pad at a substrate top side; forming a resist layer directly on the substrate top side, the resist layer having a resist top side with a channel array adjacent the outer pad exposed from the resist layer; mounting an integrated circuit having an active side facing the resist top side, the integrated circuit having a non-horizontal side adjacent the outer pad; and forming a dielectric between the active side and the resist top side, the dielectric having a fillet extended from the non-horizontal side to the substrate top side inside an inner extent of the channel array.

20 Claims, 5 Drawing Sheets

INTEGRATED CIRCUIT PACKAGING SYSTEM WITH DIELECTRIC SUPPORT AND METHOD OF MANUFACTURE THEREOF

TECHNICAL FIELD

The present invention relates generally to an integrated circuit packaging system, and more particularly to a system for an integrated circuit packaging system with a dielectric.

BACKGROUND ART

Electronic products such as cell phone base products, global positioning systems (GPS), satellites, communication equipment, consumer products, and a vast line of other similar products are in ever increasing global demand. It is very important for products to continue to improve in features, performance, and reliability while reducing product costs, product size, and to be available quickly for purchase by the consumers or buyers.

Products must be capable of competing in world markets and attracting many consumers or buyers. Market growth for high density and high output/input integrated circuit packages has resulted in a trend for electronic products that are lightweight, smaller, multi-functional, and capable of ever increasing higher speeds.

Smaller packages need to be electrically connected with other parts and components. As the smaller packages with more circuits continue to be shrunk in size, there is a greater need to produce the smaller packages at a reduced cost with increases in product yields and product reliability.

Thus, an increasing need remains to increase manufacturing throughput and the product reliability while reducing costs because of manufacturing scrap and rework of parts. It is also critical that the smaller packages are easily manufactured using automated packaging machinery. Smaller packages must be able to connect to circuit boards and deliver increasing functionality, speed, and performance. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a package substrate having an outer pad at a substrate top side; forming a resist layer directly on the substrate top side, the resist layer having a resist top side with a channel array adjacent the outer pad exposed from the resist layer; mounting an integrated circuit having an active side facing the resist top side, the integrated circuit having a non-horizontal side adjacent the outer pad; and forming a dielectric between the active side and the resist top side, the dielectric having a fillet extended from the non-horizontal side to the substrate top side inside an inner extent of the channel array.

The present invention provides an integrated circuit packaging system, including: a package substrate having an outer pad at a substrate top side; a resist layer directly on the substrate top side, the resist layer having a resist top side with a channel array adjacent the outer pad exposed from the resist layer; an integrated circuit having an active side facing the resist top side, the integrated circuit having a non-horizontal side adjacent the outer pad; and a dielectric between the active side and the resist top side, the dielectric having a fillet extended from the non-horizontal side to the substrate top side inside an inner extent of the channel array.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
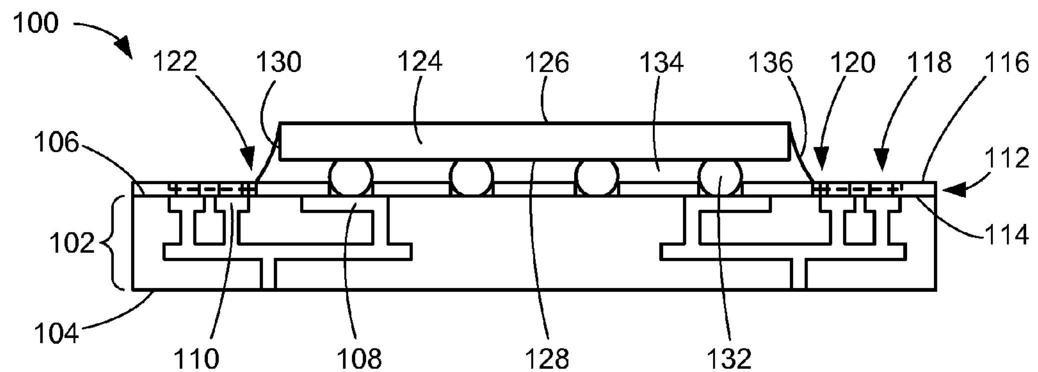
FIG. 1 is a cross-sectional view of an integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term “horizontal” as used herein is defined as a plane parallel to the plane or surface of the integrated circuit, regardless of its orientation. The term “vertical” refers to a direction perpendicular to the horizontal as just defined. Terms, such as “above”, “below”, “bottom”, “top”, “side” (as in “sidewall”), “higher”, “lower”, “upper”, “over”, and “under”, are defined with respect to the horizontal plane, as shown in the figures.

The term “on” means that there is direct contact between elements. The term “directly on” means that there is direct contact between one element and another element without an intervening element.

The term “active side” refers to a side of a die, a module, a package, or an electronic structure having active circuitry fabricated thereon or having elements for connection to the active circuitry within the die, the module, the package, or the electronic structure. The term “processing” as used herein includes deposition of material or photoresist, patterning, exposure, development, etching, cleaning, and/or removal of the material or photoresist as required in forming a described structure.

A flip chip package is an advanced integrated packaging design that meets a demand for faster integrated circuit technology with increased input/output (I/O) counts. Capillary underfill techniques are becoming very important for new product development according to increasing interest of flip chip devices in market.

Typically, flip chip devices or packages, such as flip chip fine pitch ball grid array package on package base molded laser package (fcFBGA-PoPb MLP) using a capillary underfill material, have encountered problems with rejects due to various defects. The defects can include a bleeding issue on a printed circuit board (PCB) surface due to a low viscosity of a capillary underfill material property, an underfill (UF) material on a chip due to an available dispense zone or a keep out zone (KOZ) that is too narrow, and a delamination problem between an underfill and a solder resist material.

During an underfill process for flip chip packages, problems with an overflow on the top of a die and a large dispense tongue or bleeding have occurred due to non-optimized parameters, such as dispensing volume, z-height, and dispensing distance from a chip edge. For a barrier-type flip chip packages, an underfill needs to be dispensed with a sufficient dispense zone on a substrate. Therefore, it is necessary to have a good workable method such that there is no underfill bleeding on a pad that is to be connected to a solder ball as well as proper under-filling between bumps.

Embodiments of the present invention provide answers or solutions to the problems by providing a new solder resist (SR) channel method instead of methods for conventional solder resist (SR) dam type flip chip packages. The embodiments also provide cost reduction benefit compared to flip chip packages with a solder resist (SR) dam method that has difficulty to get a dam stack higher.

Figure 2:
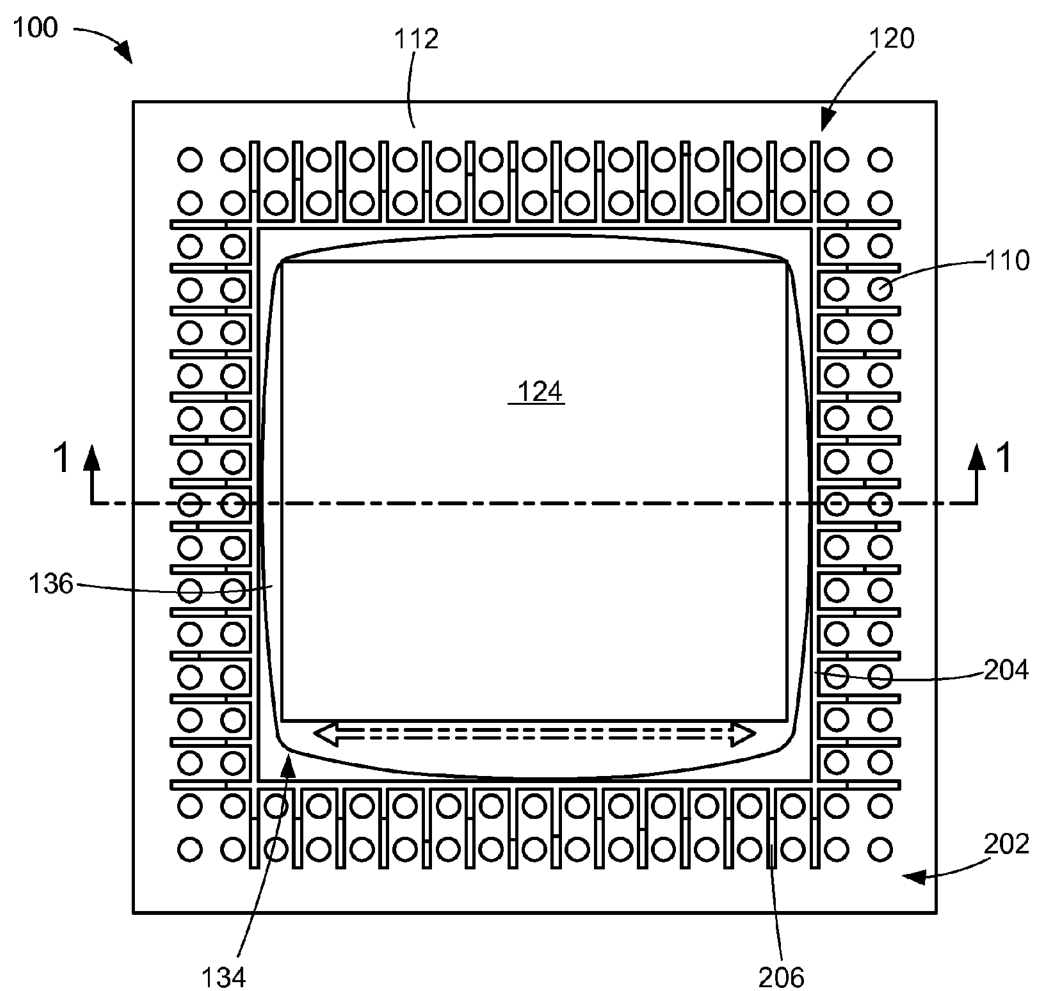
FIG. 2 is a top view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 can include a package substrate 102 having a substrate bottom side 104 with a substrate top side 106 opposite the substrate bottom side 104.

The package substrate 102 can include inner pads 108 and outer pads 110 that are at the substrate top side 106 providing connection sites to electrically connect semiconductor devices and the package substrate 102. The package substrate 102 can include an insulation layer surrounding the inner pads 108 and the outer pads 110.

The package substrate 102 can include conductive layers providing electrical conductivity between the substrate bottom side 104 and the substrate top side 106. The conductive layers, the inner pads 108, and the outer pads 110 can be formed with an electrically conductive material, such as active copper (Cu) or any metallic or non-metallic conductive material.

The integrated circuit packaging system 100 can include a resist layer 112 formed directly on the substrate top side 106 providing protection for the inner pads 108 and the outer pads 110 from contamination or delamination. The resist layer 112 is preferably a dielectric material, such as non-conductive materials including solder resist or passivation.

The resist layer 112 can prevent solder bridging or electrical shorts between the inner pads 108 or between the outer pads 110. The resist layer 112 can include a resist bottom side 114 with a resist top side 116 opposite the resist bottom side 114.

The resist layer 112 can include resist cavities 118 through the resist bottom side 114 and the resist top side 116. One of the resist cavities 118 can expose portions of the inner pads 108 and the outer pads 110. Each of the resist cavities 118 is preferably a hole, such as a solder resist opening.

The resist layer 112 can include a channel array 120 having a grid pattern with a recess 122 for receiving an excess of an underfill material. The channel array 120 can include channels that are formed in straight lines intersecting or connecting to each other.

The channel array 120 can include a height less than a height of the resist layer 112. Heights of the channel array 120 and the resist layer 112 are vertical distances between vertical extents of the channel array 120 and the resist layer 112, respectively. For example, the channel array 120 can include a height less than or approximately equal to half of a height of the resist layer 112.

The integrated circuit packaging system 100 can include an integrated circuit 124 having an inactive side 126 with an active side 128 opposite the inactive side 126. The integrated circuit 124 is preferably a semiconductor device, such as a flip chip. The active side 128 can be facing the resist top side 116.

The integrated circuit 124 can include a non-horizontal side 130 having a plane intersecting or perpendicular to planes of the inactive side 126 and the active side 128. The non-horizontal side 130 can be adjacent the outer pads 110. The integrated circuit 124 can include connectors 132 connected or attached to the active side 128 and the inner pads 108 providing electrical conductivity between the integrated circuit 124 and the package substrate 102.

The integrated circuit packaging system 100 can include a dielectric 134 covering the connectors 132 providing protection to the connectors 132. The dielectric 134 is preferably an insulation material, such as non-conductive materials including a capillary underfill material or an epoxy resin. The dielectric 134 can be dispensed in a space between the active side 128 and the resist top side 116. The dielectric 134 can be formed within the resist cavities 118 that expose the inner pads 108.

The dielectric 134 can include a fillet 136 extended from the non-horizontal side 130 to the substrate top side 106. The fillet 136 can be outside of a horizontal extent of the integrated circuit 124. The fillet 136 is inside an inner extent of the channel array 120.

It has been discovered that the channel array 120 receiving an excess of the dielectric 134 improves reliability for a flip chip package with an underfill thereby eliminating underfill bleeding on the outer pads 110 resulting in an improved underfill (UF) process for packages such as flip chip package on package (fcPOP) and molded laser package on package (MLP).

It has also been discovered that the channel array 120 and the dielectric 134 having the fillet 136 inside the inner extent of the channel array 120 significantly reduce a package dimension compared to conventional flip chip packages resulting in reduction of a dispense zone on a substrate.

Referring now to FIG. 2, therein is shown a top view of the integrated circuit packaging system 100. The integrated circuit packaging system 100 can include a single channel type.

The channel array 120 can receive an excess of the dielectric 134 overflow at a resist perimeter region 202 of the resist layer 112. The resist perimeter region 202 is defined as a region without the outer pads 110 and at an outer perimeter of the resist layer 112.

The outer pads 110 can be adjacent or outside the perimeter of the integrated circuit 124. The outer pads 110 can be between the perimeter of the integrated circuit 124 and the resist perimeter region 202. For illustrative purposes, the outer pads 110 are shown with two rows, although it is understood that any number of rows of the outer pads 110 can be formed.

The channel array 120 preferably includes primary channels 204 and auxiliary channels 206 connected to each other and formed as a single contiguous structure. The primary channels 204 and the auxiliary channels 206 are outside of the fillet 136.

For example, the primary channels 204 and the auxiliary channels 206 can be selectively formed with a solder resist (SR) development process at a printed circuit (PCB) manufacturing site. Also for example, the primary channels 204 and the auxiliary channels 206 can be formed with a substrate build up process using trench technology in high volume manufacturing (HVM). Further, for example, channel design can be limited or dependent on a package design.

The primary channels 204 are formed to collect or receive an excess of the dielectric 134 to limit a size or an extent of the fillet 136. The auxiliary channels 206 are formed to collect or receive an excess of the dielectric 134 that is overflow from the primary channels 204 with the overflow flowing in a direction perpendicular to a perimeter side of the integrated circuit 124. For example, the dielectric 134 can bleed on the primary channels 204 and the auxiliary channels 206 instead of on the outer pads 110.

The primary channels 204 can be adjacent or surrounding a perimeter of the integrated circuit 124. The primary channels 204 can be adjacent or between the perimeter of the integrated circuit 124 and a number of rows of the outer pads 110. One of the primary channels 204 can intersect another of the primary channels 204 near a corner of the resist layer 112.

The primary channels 204 can be away from the perimeter of the integrated circuit 124 providing a space for the fillet 136 or an underfill (UF) dispense zone, as shown with an arrow. The primary channels 204 can be between an edge of the fillet 136 of an underfill dispense zone and the outer pads 110. The primary channels 204 can be around the outer pads 110.

The auxiliary channels 206 can be perpendicular to the primary channels 204. The auxiliary channels 206 of the channel array 120 can extend radially, from the primary channels 204 and the non-horizontal side 130 of the integrated circuit 124, beyond the outer pads 110, to the resist perimeter region 202. The auxiliary channels 206 can be formed around the outer pads 110. The auxiliary channels 206 can be formed between one of the outer pads 110 and another of the outer pads 110 with the one of the outer pads 110 and the another of the outer pads 110 straddling the auxiliary channels 206.

The auxiliary channels 206 can include lengths less than lengths of the primary channels 204. Lengths of the primary channels 204 and the auxiliary channels 206 are longest distances between extents of the primary channels 204 and the auxiliary channels 206, respectively.

It has been discovered that the channel array 120 having the primary channels 204 and the auxiliary channels 206 significantly reduces cost compared to flip chip packages with solder resist dam type.

Figure 3:
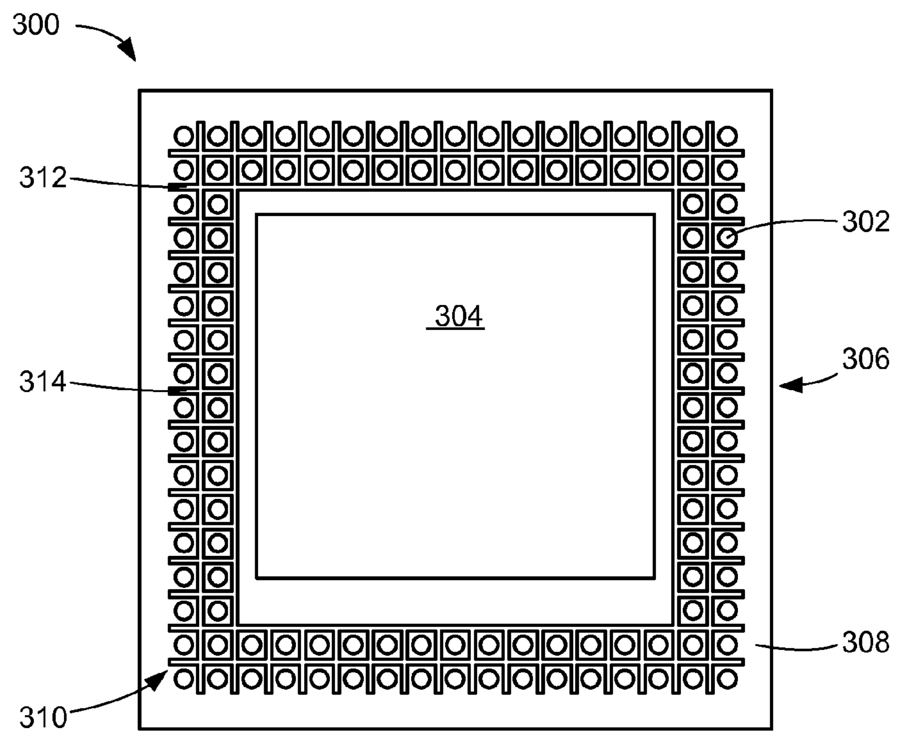
FIG. 3 is a top view of an integrated circuit packaging system in a second embodiment of the present invention.

Referring now to FIG. 3, therein is shown a top view of an integrated circuit packaging system 300 in a second embodiment of the present invention. The top view depicts the integrated circuit packaging system 300 having a cross channel type before under-filling. In a manner similar to the integrated circuit packaging system 100 of FIG. 2, the integrated circuit packaging system 300 includes outer pads 302, an integrated circuit 304, and a resist layer 306 having a resist perimeter region 308 and a channel array 310 with primary channels 312 and auxiliary channels 314.

A first of the primary channels 312 can be parallel to a perimeter side of the integrated circuit 304. The first of the primary channels 312 can be between a row of the outer pads 302 and another row of the outer pads 302.

A second of the primary channels 312 can be parallel to another perimeter side of the integrated circuit 304. The second of the primary channels 312 can between a row of the outer pads 302 and another row of the outer pads 302. The second of the primary channels 312 can intersect the first of the primary channels 312 near a corner of the resist layer 306.

It has been discovered that the channel array 310 improves reliability with the primary channels 312 between rows of the outer pads 302 providing additional channel capacity to eliminate contamination to the outer pads 302.

Figure 4:
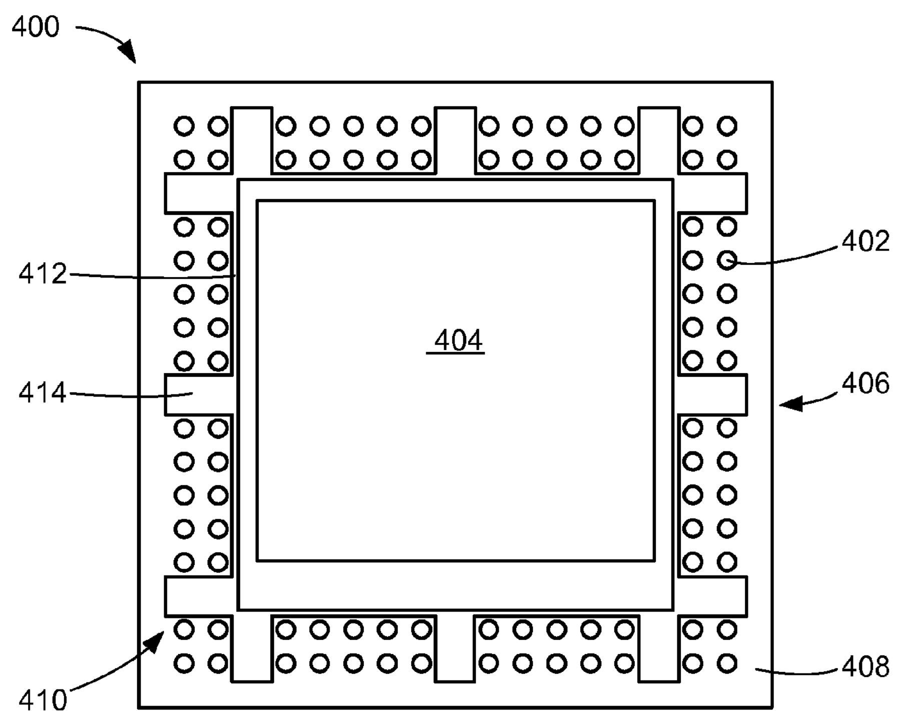
FIG. 4 is a top view of an integrated circuit packaging system in a third embodiment of the present invention.

Referring now to FIG. 4, therein is shown a top view of an integrated circuit packaging system 400 in a third embodiment of the present invention. The top view depicts the integrated circuit packaging system 400 having a wide channel type before under-filling. In a manner similar to the integrated circuit packaging system 100 of FIG. 2, the integrated circuit packaging system 400 includes outer pads 402, an integrated circuit 404, and a resist layer 406 having a resist perimeter region 408 and a channel array 410 with primary channels 412 and auxiliary channels 414.

The auxiliary channels 414 can include widths greater than widths of the primary channels 412. For illustrative purposes, the auxiliary channels 414 are shown having widths at least four times widths of the primary channels 412, although it is understood that the channel array 410 can include any ratios of widths of the auxiliary channels 414 to widths of the primary channels 412.

A design of the outer pads 402 can be changed or determined based on widths of the auxiliary channels 414. For example, a number of the outer pads 402 can be less than a number of the outer pads 110 of FIG. 2 due to widths of the auxiliary channels 414 greater than widths of the auxiliary channels 206 of FIG. 2.

It has been discovered that the auxiliary channels 414 improve reliability with the auxiliary channels 414 having widths greater than widths of the primary channels 412 providing additional channel capacities to eliminate contamination to the outer pads 402.

Figure 5:
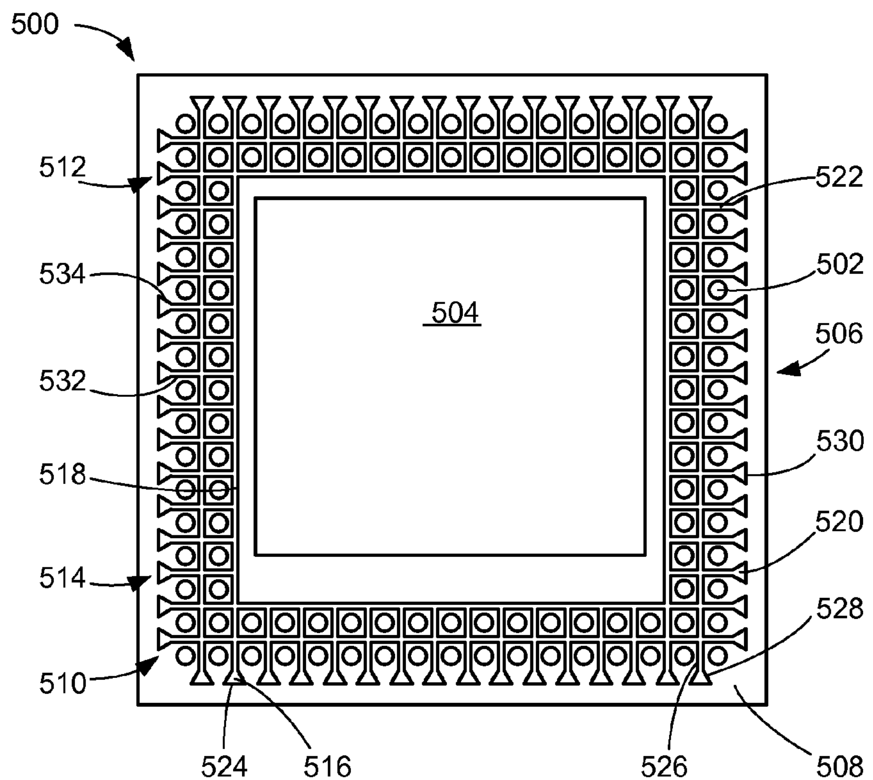
FIG. 5 is a top view of an integrated circuit packaging system in a fourth embodiment of the present invention.

Referring now to FIG. 5, therein is shown a top view of an integrated circuit packaging system 500 in a fourth embodiment of the present invention. In a manner similar to the integrated circuit packaging system 300 of FIG. 3, the integrated circuit packaging system 500 includes outer pads 502, an integrated circuit 504, and a resist layer 506 having a resist perimeter region 508 and a channel array 510 with primary channels 512 and auxiliary channels 514.

The integrated circuit packaging system 500 also includes each of the primary channels 512 having a primary end 516 connected to a primary base 518. The primary end 516 is an end of one of the primary channels 512 at the resist perimeter region 508. The primary end 516 can be further to the integrated circuit 504 than the primary base 518. For illustrative purposes, the primary end 516 is shown as a trapezoid, although it is understood that the primary end 516 can include any other shape.

The primary base 518 can be between the integrated circuit 504 and the outer pads 502. The primary base 518 can be between one of the outer pads 502 and another of the outer pads 502.

For example, the primary end 516 and the primary base 518 can include an outer trench and an inner trench, respectively. Also for example, the primary end 516 can be wider than the primary base 518.

The integrated circuit packaging system 500 also includes each of the auxiliary channels 514 having an auxiliary end 520 connected to an auxiliary base 522. The auxiliary end 520 is an end of one of the auxiliary channels 514 at the resist perimeter region 508. The auxiliary end 520 can be further to the primary channels 512 than the auxiliary base 522. The auxiliary end 520 can be adjacent the primary end 516 or another of the auxiliary end 520. For illustrative purposes, the auxiliary end 520 is shown as a trapezoid, although it is understood that the auxiliary end 520 can include any other shape.

The auxiliary base 522 can be between one of the outer pads 502 and another of the outer pads 502. The auxiliary base 522 can be connected to the primary base 518 of one of the primary channels 512.

For example, the auxiliary end 520 and the auxiliary base 522 can include an outer trench and an inner trench, respectively. Also for example, the auxiliary end 520 can be wider than the auxiliary base 522.

The primary end 516 can include a primary outer side 524. The primary outer side 524 can include a length greater than a width of the primary base 518. The width of the primary base 518 is a shortest distance between primary base sides 526 of the primary base 518.

The primary end 516 can include primary connection sides 528 having planes intersecting planes of the primary outer side 524 and the primary base sides 526. Each of the primary connection sides 528 can include an acute angle to the primary outer side 524 and an obtuse angle to one of the primary base sides 526.

The auxiliary end 520 can include an auxiliary outer side 530. The auxiliary outer side 530 can include a length greater than a width of the auxiliary base 522. The width of the auxiliary base 522 is a shortest distance between auxiliary base sides 532 of the auxiliary base 522.

The auxiliary end 520 can include auxiliary connection sides 534 having planes intersecting planes of the auxiliary outer side 530 and the auxiliary base sides 532. Each of the auxiliary connection sides 534 can include an acute angle to the auxiliary outer side 530 and an obtuse angle to one of the auxiliary base sides 532.

It has been discovered that the primary channels 512 and the auxiliary channels 514 improve reliability with the primary end 516 and the auxiliary end 520 having lengths greater than widths of the primary base 518 and the auxiliary base 522, respectively, providing additional channel capacity to allow a capillary underfill to outwardly flow from a dispense zone so that the capillary underfill may not build up and wet the outer pads 502.

Figure 6:
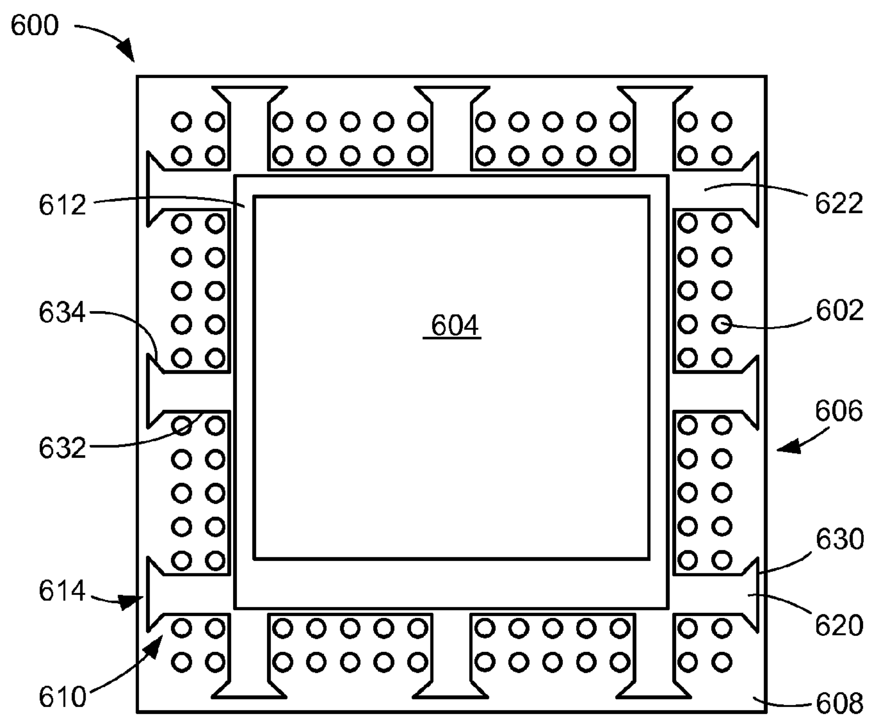
FIG. 6 is a top view of an integrated circuit packaging system in a fifth embodiment of the present invention.

Referring now to FIG. 6, therein is shown a top view of an integrated circuit packaging system 600 in a fifth embodiment of the present invention. In a manner similar to the integrated circuit packaging system 400 of FIG. 4, the integrated circuit packaging system 600 includes outer pads 602, an integrated circuit 604, and a resist layer 606 having a resist perimeter region 608 and a channel array 610 with primary channels 612 and auxiliary channels 614.

The integrated circuit packaging system 600 also includes each of the auxiliary channels 614 having an auxiliary end 620 connected to an auxiliary base 622. The auxiliary end 620 is an end of one of the auxiliary channels 614 at the resist perimeter region 608. The auxiliary end 620 can be further to the primary channels 612 than the auxiliary base 622. For illustrative purposes, the auxiliary end 620 is shown as a trapezoid, although it is understood that the auxiliary end 620 can include any other shape.

The auxiliary base 622 can be between one of the outer pads 602 and another of the outer pads 602. The auxiliary base 622 can be connected to one of the primary channels 612.

The auxiliary end 620 can include an auxiliary outer side 630. The auxiliary outer side 630 can include a length greater than a width of the auxiliary base 622. The width of the auxiliary base 622 is a shortest distance between auxiliary base sides 632 of the auxiliary base 622.

The auxiliary end 620 can include auxiliary connection sides 634 having planes intersecting planes of the auxiliary outer side 630 and the auxiliary base sides 632. Each of the auxiliary connection sides 634 can include an acute angle to the auxiliary outer side 630 and an obtuse angle to one of the auxiliary base sides 632.

It has been discovered that the auxiliary channels 614 improve reliability with the auxiliary end 620 having a length greater than a width of the auxiliary base 622 providing an additional channel capacity to allow a capillary underfill to outwardly flow from a dispense zone so that the capillary underfill may not build up and wet the outer pads 602.

Figure 7:
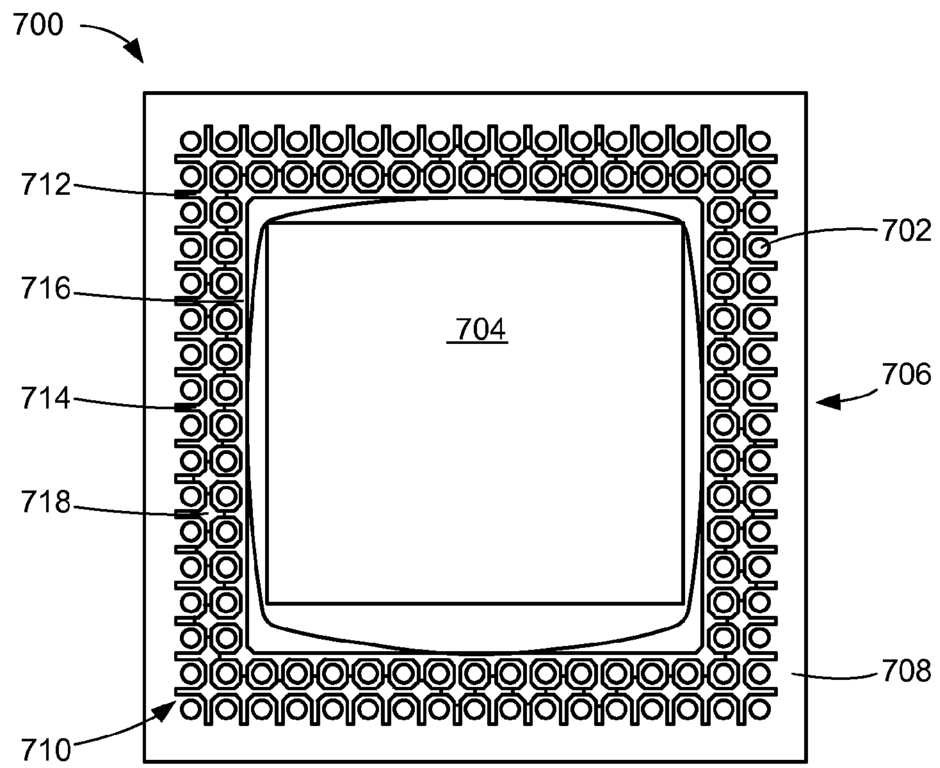
FIG. 7 is a top view of an integrated circuit packaging system in a sixth embodiment of the present invention.

Referring now to FIG. 7, therein is shown a top view of an integrated circuit packaging system 700 in a sixth embodiment of the present invention. In a manner similar to the integrated circuit packaging system 300 of FIG. 3, the integrated circuit packaging system 700 includes outer pads 702, an integrated circuit 704, and a resist layer 706 having a resist perimeter region 708 and a channel array 710 with primary channels 712 and auxiliary channels 714.

The integrated circuit packaging system 700 also includes the channel array 710 having medium intersections 716 and largest intersections 718. The medium intersections 716 are regions of the channel array 710 at which the auxiliary channels 714 are connected to the primary channels 712. The largest intersections 718 are regions of the channel array 710 at which the primary channels 712 intersect each other or at which the primary channels 712 intersect the auxiliary channels 714.

Figure 8:
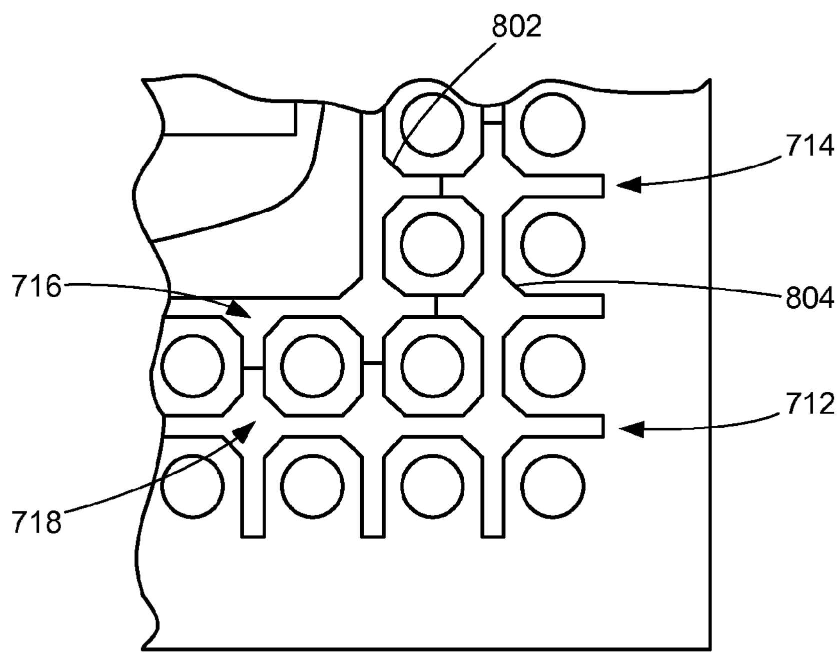
FIG. 8 is a detailed view of a portion of the structure of FIG. 7.

Referring now to FIG. 8, therein is shown a detailed view of a portion of the structure of FIG. 7. Each of the medium intersections 716 can include expanded openings with two medium intersection sides 802. One of the medium intersection sides 802 can be at an obtuse angle to a side of one of the primary channels 712 and at an obtuse angle to a side of one of the auxiliary channels 714.

Each of the largest intersections 718 can include expanded openings with four largest intersection sides 804. One of the largest intersection sides 804 can be at an obtuse angle to a side of one of the primary channels 712 and at an obtuse angle to a side of another of the primary channels 712. Another of the largest intersection sides 804 can be at an obtuse angle to a side of one of the primary channels 712 and at an obtuse angle to a side of another of the auxiliary channels 714.

For illustrative purposes, the medium intersection sides 802 and the largest intersection sides 804 are shown having flat surfaces, although it is understood that the medium intersection sides 802 and the largest intersection sides 804 can include any other surfaces. For example, the medium intersection sides 802 and the largest intersection sides 804 can include curved surfaces at radial distances from centers of the medium intersections 716 and the largest intersections 718, respectively.

Each of the medium intersections 716 can include an opening larger than an opening of one of intersections of FIG. 3 at which the primary channels 312 of FIG. 3 intersect each other or at which the primary channels 312 of FIG. 3 intersect the auxiliary channels 314 of FIG. 3. Each of the largest intersections 718 can include an opening larger than an opening of each of the medium intersections 716.

It has been discovered that the medium intersections 716 and the largest intersections 718 improve reliability by providing additional channel capacities with the medium intersections 716 and the largest intersections 718 having openings larger than openings of the intersections of FIG. 3.

Figure 9:
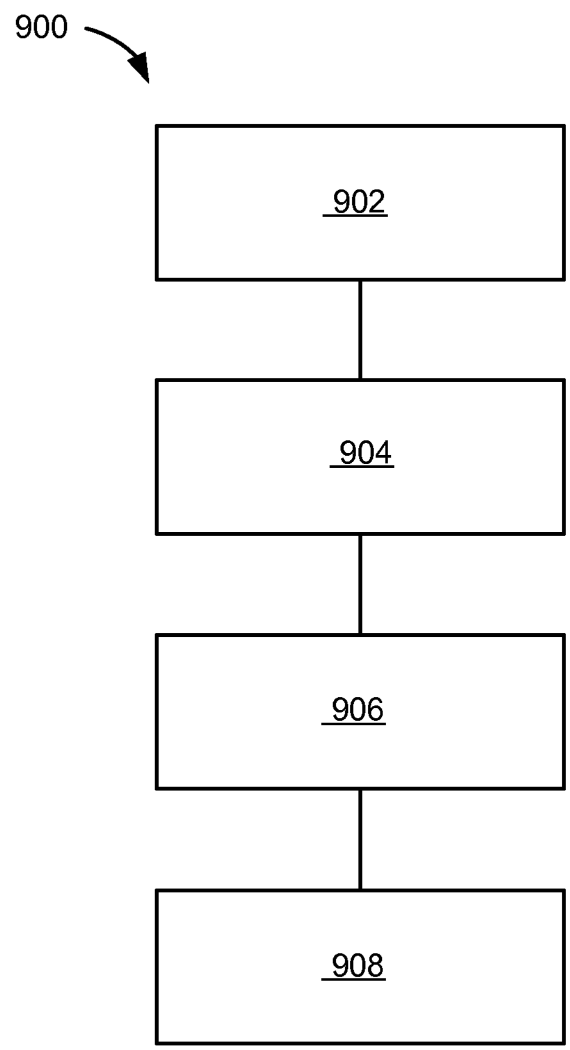
FIG. 9 is a flow chart of a method of manufacture of the integrated circuit packaging system in a further embodiment of the present invention.

Referring now to FIG. 9, therein is shown a flow chart of a method 900 of manufacture of the integrated circuit packaging system 100 in a further embodiment of the present invention. The method 900 includes: providing a package substrate having an outer pad at a substrate top side in a block 902; forming a resist layer directly on the substrate top side, the resist layer having a resist top side with a channel array adjacent the outer pad exposed from the resist layer in a block 904; mounting an integrated circuit having an active side facing the resist top side, the integrated circuit having a non-horizontal side adjacent the outer pad in a block 906; and forming a dielectric between the active side and the resist top side, the dielectric having a fillet extended from the non-horizontal side to the substrate top side inside an inner extent of the channel array in a block 908.

Thus, it has been discovered that the integrated circuit packaging system of the present invention furnishes important and heretofore unknown and unavailable solutions, capabilities, and functional aspects for an integrated circuit packaging system with a dielectric. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:

providing a package substrate having an outer pad at a substrate top side;

forming a resist layer directly on the substrate top side, the resist layer having a resist top side with a channel array adjacent the outer pad exposed from the resist layer;

mounting an integrated circuit having an active side facing the resist top side, the integrated circuit having a non-horizontal side adjacent the outer pad, the channel array extended radially from the integrated circuit and beyond the outer pad for eliminating underfill bleed on to the outer pad; and forming a dielectric between the active side and the resist top side, the dielectric having a fillet extended from the non-horizontal side to the substrate top side.

2. The method as claimed in claim 1 wherein forming the resist layer includes forming the channel array having a primary channel between the integrated circuit and the outer pad.

3. The method as claimed in claim 1 wherein forming the resist layer includes forming the channel array having a primary channel between the outer pad and another of the outer pad.

4. The method as claimed in claim 1 wherein forming the resist layer includes forming the channel array having a primary channel having a primary outer side with a length greater than a width of a primary base of the primary channel, the primary base between the outer pad and another of the outer pad.

5. The method as claimed in claim 1 wherein forming the resist layer includes forming the channel array having a primary channel and an auxiliary channel, the primary channel between the integrated circuit and the outer pad, the auxiliary channel connected to the primary channel at a medium intersection of the channel array.

6. A method of manufacture of an integrated circuit packaging system comprising:

providing a package substrate having an inner pad and an outer pad that are at a substrate top side;

forming a resist layer directly on the substrate top side, the resist layer having a resist top side with a channel array adjacent the outer pad exposed from the resist layer;

mounting an integrated circuit having an active side facing the resist top side and having a connector attached to the inner pad exposed from the resist layer, the integrated circuit having a non-horizontal side adjacent the outer pad, the channel array extended radially from the integrated circuit and beyond the outer pad for eliminating underfill bleed on to the outer pad; and forming a dielectric between the active side and the resist top side, the dielectric having a fillet extended from the non-horizontal side to the substrate top side.

7. The method as claimed in claim 6 wherein forming the resist layer includes forming the channel array having a primary channel and an auxiliary channel perpendicular to the primary channel, the primary channel between the integrated circuit and the outer pad.

8. The method as claimed in claim 6 wherein forming the resist layer includes forming the channel array having a primary channel and an auxiliary channel with a width greater than a width of the primary channel, the primary channel between the integrated circuit and the outer pad.

9. The method as claimed in claim 6 wherein forming the resist layer includes forming the channel array having a primary channel with a primary outer side at a resist perimeter region of the resist layer.

10. The method as claimed in claim 6 wherein forming the resist layer includes forming the channel array having a primary channel and an auxiliary channel intersecting the primary channel at a largest intersection of the channel array, the primary channel between the outer pad and another of the outer pad.

11. An integrated circuit packaging system comprising:

a package substrate having an outer pad at a substrate top side;

a resist layer directly on the substrate top side, the resist layer having a resist top side with a channel array adjacent the outer pad exposed from the resist layer;

an integrated circuit having an active side facing the resist top side, the integrated circuit having a non-horizontal side adjacent the outer pad, the channel array extended radially from the integrated circuit and beyond the outer pad for eliminating underfill bleed on to the outer pad; and a dielectric between the active side and the resist top side, the dielectric having a fillet extended from the non-horizontal side to the substrate top side.

12. The system as claimed in claim 11 wherein the resist layer includes the channel array having a primary channel between the integrated circuit and the outer pad.

13. The system as claimed in claim 11 wherein the resist layer includes the channel array having a primary channel between the outer pad and another of the outer pad.

14. The system as claimed in claim 11 wherein the resist layer includes the channel array having a primary channel having a primary outer side with a length greater than a width of a primary base between the outer pad and another of the outer pad.

15. The system as claimed in claim 11 wherein the resist layer includes the channel array having a primary channel and an auxiliary channel connected to the primary channel at a medium intersection of the channel array, the primary channel between the integrated circuit and the outer pad.

16. The system as claimed in claim 11 wherein:

the package substrate includes an inner pad at the substrate top side; and the integrated circuit includes a connector attached to the inner pad exposed from the resist layer.

17. The system as claimed in claim 16 wherein the resist layer includes the channel array having a primary channel and an auxiliary channel perpendicular to the primary channel, the primary channel between the integrated circuit and the outer pad.

18. The system as claimed in claim 16 wherein the resist layer includes the channel array having a primary channel and an auxiliary channel with a width greater than a width of the primary channel, the primary channel between the integrated circuit and the outer pad.

19. The system as claimed in claim 16 wherein the resist layer includes the channel array having a primary channel with a primary outer side at a resist perimeter region of the resist layer.

20. The system as claimed in claim 16 wherein the resist layer includes the channel array having a primary channel and an auxiliary channel intersecting the primary channel at a largest intersection, the primary channel between the outer pad and another of the outer pad.

* * * * *